(12) United States Patent
Jensen et al.

(10) Patent No.: US 6,595,785 B2
(45) Date of Patent: Jul. 22, 2003

(54) BUMP CONTACT FORCE CONCENTRATION SYSTEM AND METHOD

(75) Inventors: Eric D. Jensen, Irvine, CA (US); Christopher M. Schreiber, Lake Elsinore, CA (US); Terry S. Wang, Irvine, CA (US); Scott P. Cohen, Costa Mesa, CA (US); Robert E. Daugherty, Irvine, CA (US); Blake F. Woith, Santa Ana, CA (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/972,122

(22) Filed: Oct. 5, 2001

(65) Prior Publication Data

US 2003/0068905 A1 Apr. 10, 2003

(51) Int. Cl.[7] ............................................... H01R 12/00
(52) U.S. Cl. ........................................................ 439/66
(58) Field of Search ............................ 439/66, 67, 86, 439/91, 59

(56) References Cited

U.S. PATENT DOCUMENTS

| | | | |
|---|---|---|---|
| 3,594,684 A | | 7/1971 | Miller .......................... 439/67 |
| 4,227,767 A | | 10/1980 | Mouissie ..................... 439/493 |
| 5,123,852 A | * | 6/1992 | Gillett ......................... 439/496 |
| 5,211,577 A | | 5/1993 | Daugherty ................... 439/493 |
| 5,224,865 A | | 7/1993 | Woith et al. .................. 439/67 |
| 5,372,512 A | | 12/1994 | Wilson et al. ................. 439/67 |
| 5,505,626 A | * | 4/1996 | Grabbe et al. ................. 439/62 |
| 5,726,432 A | | 3/1998 | Reichardt .................... 235/441 |

* cited by examiner

Primary Examiner—Tulsidas Patel
(74) Attorney, Agent, or Firm—Thomas N. Twomey

(57) ABSTRACT

A shim is provided which can be used in a connector system, whereby a flexible connector having contact surfaces is compressed against an electronic circuit board by a resilient material. The shim is incorporated between the resilient material and the flexible connector contact surfaces so as to uniformly transfer the load from the resilient material to the contact surfaces. Moreover, the shim prevents the resilient material from taking a set and the flexible connector from draping when operating under hot and/or high load conditions.

25 Claims, 4 Drawing Sheets

BUMP CONTACT FORCE CONCENTRATION SYSTEM AND METHOD

BACKGROUND OF THE INVENTION

This invention relates to clamping systems for Gold Dot connectors and more specifically to a shim used to apply a uniform load over the "gold dots" of a Gold Dot flex circuit type of connector or other similar connectors which are being clamped by a clamping system.

A flexible connector such as a Gold Dot flex circuit 10 is a connector having a flexible sheet-like substrate 11 having a plurality of contact surfaces e.g., "gold dots" 12 protruding from its surface near each end of the flex circuit as shown in FIG. 1. Each gold dot at one end is interconnected to a corresponding gold dot at the other end through traces formed within the flexible substrate. The Gold Dot flex circuit is typically used to interconnect two electronic boards. The array of gold dots at one end of the Gold Dot flex circuit make contact with an array of contact features, such as contact pads, on one electronic board while the array of gold dots at the other end of the Gold Dot flex circuit make contact with contact features, such as contact pads, at the other electronic board to be interconnected. Typically, each board and an end section of the Gold Dot flex circuit are clamped together. Specifically, a clamping system is used having a clamp member 14 into which is fitted an elastomeric pad or elastomer 16 (FIG. 2). A shield layer 18 is typically formed on the exposed surface of the elastomer. The Gold Dot flex circuit end section with the array of gold dots is placed over the elastomer 16 such that the gold dots 12 face opposite the elastomer. The electronic board 20 to be connected is then placed over the gold dots such that the contact features of the electronic board make appropriate contact with the gold dots of the Gold Dot flex circuit. A stiffener 22 is then fitted over the electronic board sandwiching the electronic board and Gold Dot flex circuit between the stiffener and the clamp member. The elastomeric pad provides compliance for urging the gold dots against the contact features on the electronic board.

To ensure proper alignment two threaded pins 24 are typically fitted in the clamp member and protrude through openings 27 in the Gold Dot flex circuit, electronic board and stiffener. Internally threaded members 26 such as nuts are then threaded on the pins to clamp the stiffener against the clamp member.

When the elastomer 16 is transferring a high load from the clamping system to the gold dots, the flexible substrate of the Gold Dot flex circuit drapes around each gold dot. A high load is the load required for causing draping of the Gold Dot flex circuit such that its substrate 11 surrounding the gold dots 12 contacts the elastomeric board, as for example shown in FIG. 3. When the elastomer is transferring a high load at under a high temperature conditions (typically over 120° C.), the elastomer takes a set, i.e., it deforms and becomes less effective (FIG. 3). Specifically during high temperatures, the Gold Dot flex circuit flexible substrate tends to drape around the gold dots as shown in FIG. 3 and the elastomer takes a set forming depressions 27 to accommodate the gold dots 12. Consequently, the load applied by the elastomer to the gold dots is reduced since some of the load is transferred to the electronic board via the flexible substrate 11 surrounding the gold dots 12. Many times, the elastomer set causes a non-uniform load to be applied to the gold dots, i.e., the load applied to each gold dot may vary from gold dot to gold dot thus reducing the integrity of the interconnection provided by the Gold Dot flex circuit.

Some clamping systems incorporate use of elastomers having bumps for directly concentrating the force over each of the gold dots. However, even these elastomers with bumps are subject to the same problems as the regular elastomers, such as setting, when operating under a hot and/or high load conditions. Furthermore, as the density of the gold dots increases, the density of the bumps in such an elastomer must also increase. As the numbers of bumps formed on the elastomer increase so does the manufacturing difficulty as well as the manufacturing costs.

As a result of the aforementioned problems, current clamping systems utilized must be capable of applying a relatively high clamping load for ensuring that the losses due to elastomer setting or deformation will be minimized. Consequently, the components of such clamping systems must be better designed and made from more expensive materials having higher strengths so that they can absorb the higher loads to which they will be imposed. A problem, however, with applying high loads is that the elastomer, whether bumped or not, will laterally expand. Consequently, the lateral dimension of the clamping system which may be limited by the geographic location of the clamping system must be such so as to account for the expansion of the elastomer. As a result, the lateral dimension of the gold dot array is limited. Moreover, in clamping systems incorporating a bumped elastomer, expansion of the elastomer when operating under hot and/or high load conditions may cause the bumps of the elastomer to misalign from the gold dots, thereby reducing the force levels applied to the gold dots to levels that may be insufficient for insuring proper contact with the electronic board.

Thus, a need exists for providing a clamping system that overcomes all of the aforementioned problems without compromising the needed compliance of the system which is provided by the elastomer.

SUMMARY OF THE INVENTION

The present invention provides for a shim 28 (FIG. 4) between an elastomer (or other resilient material member) 16 of a clamp system and a flexible connector, as for example Gold Dot flex circuit 10, so as to focus the force from the elastomer onto the contact surfaces of the flexible connector e.g., the gold dots 12, without compromising the compliance of the overall system (FIG. 5). The shim should be of sufficient size to cover the golds dots at one end of a flexible connector. In an exemplary embodiment, a separate shim maybe incorporated at each clamp system for clamping each end of the Gold Dot flex circuit. For convenience and descriptive purposes, the inventive shim is described herein for use with a Gold Dot flex circuit. However, the inventive shim can be used with other flexible connectors which may have contact features which are not in the form of gold dots. Furthermore, for convenience and descriptive purposes, a clamp system incorporating the inventive shim is described as having an elastomer. However, it should be understood that other resilient materials instead of an elastomer may be incorporated in such clamp system.

DETAILED DESCRIPTION

Figure 1:
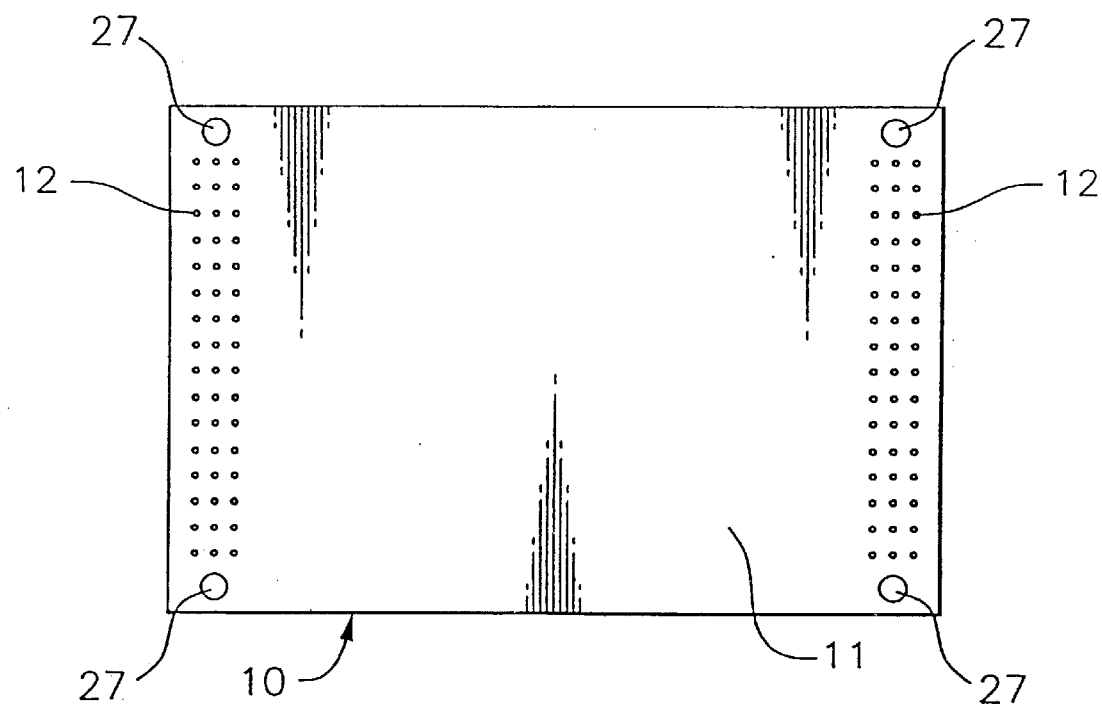
FIG. 1 is a plan view of a Gold Dot flex circuit.
Figure 2:
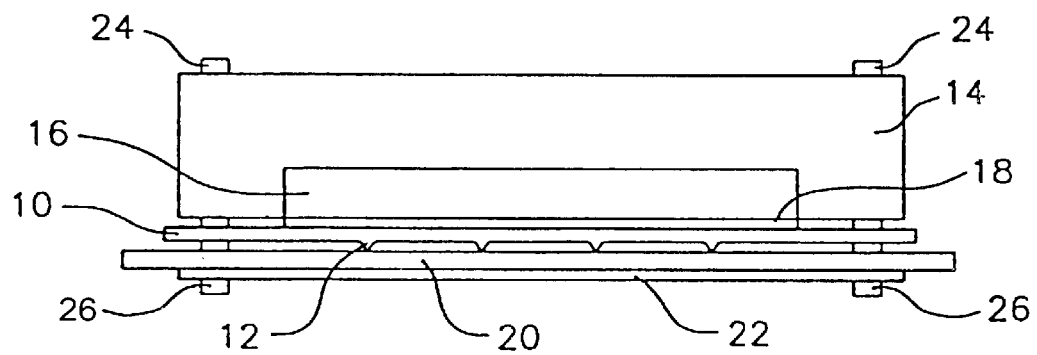
FIG. 2 is a side view of a clamping system used to clamp a Gold Dot flex circuit to an electronic board.
Figure 3:
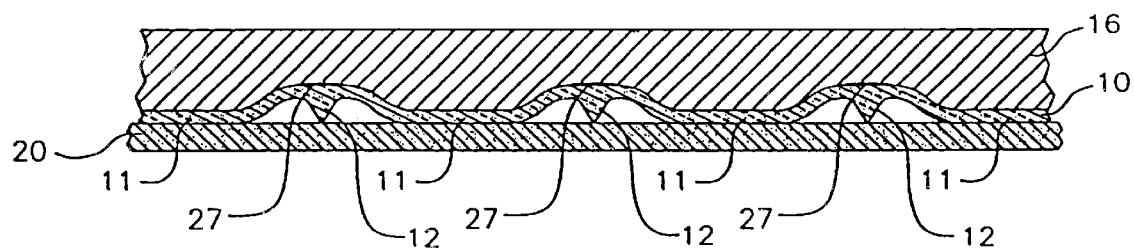
FIG. 3 is a partial cross sectional view depicting an elastomer which is set and a Gold Dot flex circuit which has draped due to operations under hot and/or high load operating conditions.
Figure 4:
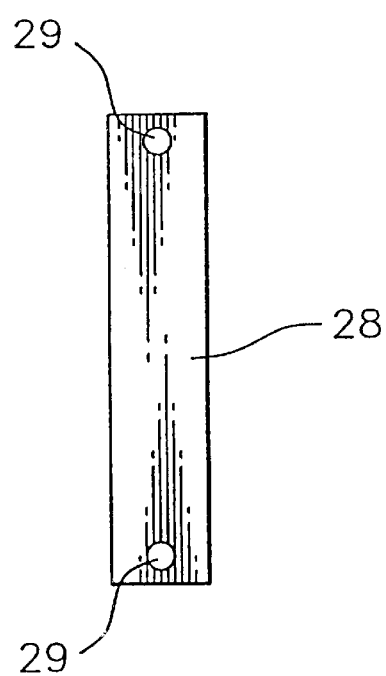
FIG. 4 is a plan view of a shim of the present invention.
Figure 5:
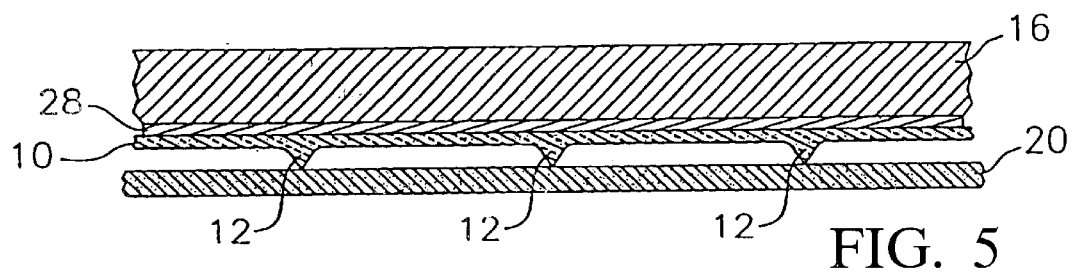
FIG. 5 is a partial cross-sectional view of a connector system of the present invention incorporating a shim.

The present invention provides for a shim 28 (FIG. 4) between an elastomer (or other resilient material member) 16 of a clamp system and a flexible connector, as for example Gold Dot flex circuit 10, so as to focus the force from the elastomer onto the contact surfaces of the flexible connector e.g., the gold dots 12, without compromising the compliance of the overall system (FIG. 5). The shim should be of sufficient size to cover the golds dots at one end of a flexible connector. In an exemplary embodiment, a separate shim may incorporated at each clamp system clamping an end of the Gold Dot flex circuit. For convenience and descriptive purposes, the inventive shim is described herein for use with a Gold Dot flex circuit. However, the inventive ship can be used with other flexible connectors which may have contact features which are not in the form of gold dots. Furthermore, for convenience and descriptive purposes, a clamp system incorporating the inventive shim is described as having an elastomer. However, it should be understood that other resilient materials instead of an elastomer may be incorporated in such clamp system.

The inventive shim 28 allows all of the force provided via the elastomer 16 to be transferred to the gold dots 12 of the Gold Dot flex circuit. The inventive shim allows for the use of a single elastomer and shim combination to enhance the function of any pattern of contacts formed on a circuit 20 underlying the Gold Dot flex circuit 10. In a preferred embodiment the shim is a sheet of stainless steel, typically a 300 or 316 series stainless steel, having a thickness of about 1 to 5 mils and preferably of about 2 mils. The shim may also be formed from a sheet of beryllium copper or may even be made of plastic.

The shim 28 is typically placed between the elastomer 16 and the Gold Dot flex circuit as shown in FIG. 5. The shim may have openings 29 to accommodate the pins 24 of a clamping system. In an alternate embodiment, the shim can be in a form of metalized layer formed on the bottom of the elastomer.

Use of the shim prevents the setting of the elastomer under hot and/or high load operating conditions. Consequently, a uniform load is applied over all the gold dots even under hot (e.g., temperatures greater than 120° C.) and/or high load operating conditions. In this regard, the sum of the force required to deform the elastomer and the force required to deform the shim can be applied to the gold dots. If the shim were not used, only the force required to deform the elastomer would be applied to the gold dots. Thus, use of a shim increases the clamping efficiency—i.e., the amount of and uniformity of the force transferred to the gold dots—of the clamping system.

The shim should be stiffer and more resilient than the elastomer so as to be able to uniformly transfer the load to the gold dots. Preferably, the shim should have a stiffness and resiliency (elasticity) that are greater than that of the Gold Dot flex circuit. However, the stiffness should not be so great as to reduce the effect of the elastomer. The stiffness of the shim should be chosen to allow the shim to elastically drape around the gold dots when exposed to excessive load and return to an undeformed shape when the excessive load is removed. In this regard, the shim provides a safety guard for preventing overloading of the gold dots. Moreover, the flexibility of the shim should be sufficient for allowing the shim to flex for accommodating the non-uniformities of the electronic board which are transposed to the flexible Gold Dot flex circuit. A desired shim flexibility can be achieved by choosing a shim of appropriate material and thickness.

Figure 6:
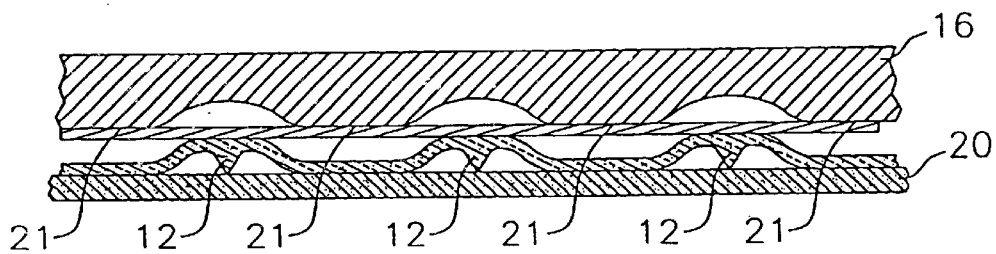
FIG. 6 is a partial cross-sectional view of a connector system of the present invention having an elastomer that has set and a Gold Dot flex circuit that has draped and incorporating a shim.
Figure 7:
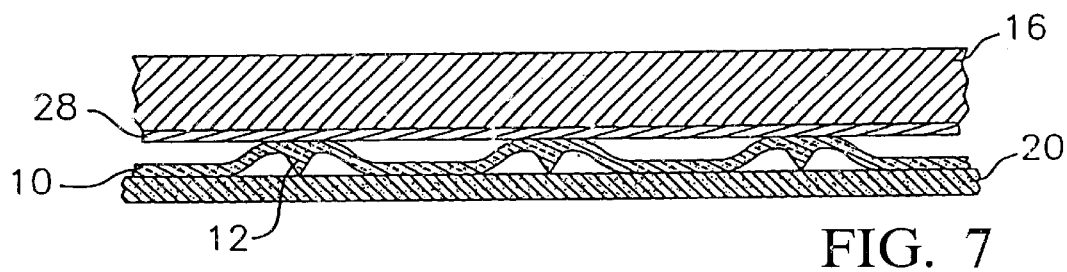
FIG. 7 is a partial cross-sectional view of a connector system of the present invention having a Gold Dot flex circuit that has draped and incorporating a shim.
Figure 8:
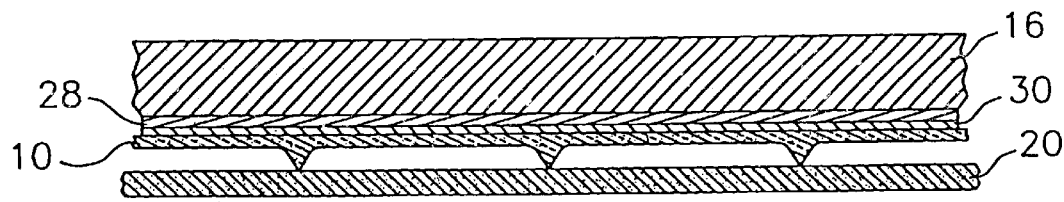
FIG. 8 is a partial cross-sectional view of a connector system of the present invention incorporating a shim sandwiched between two elastomers.
Figure 9:
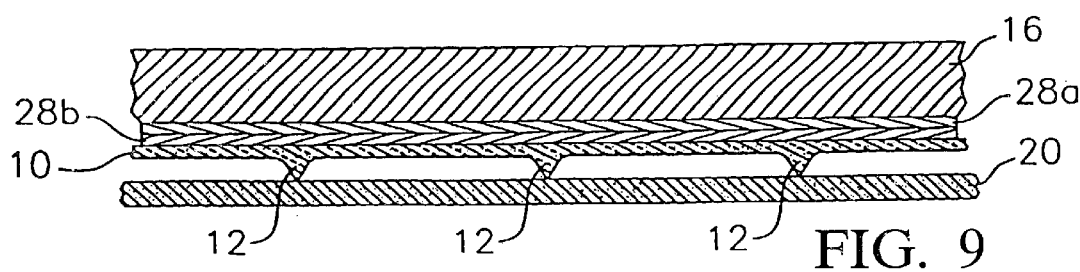
FIG. 9 is a partial cross-sectional view of a connector system of the present invention incorporating two shims.
Figure 10:
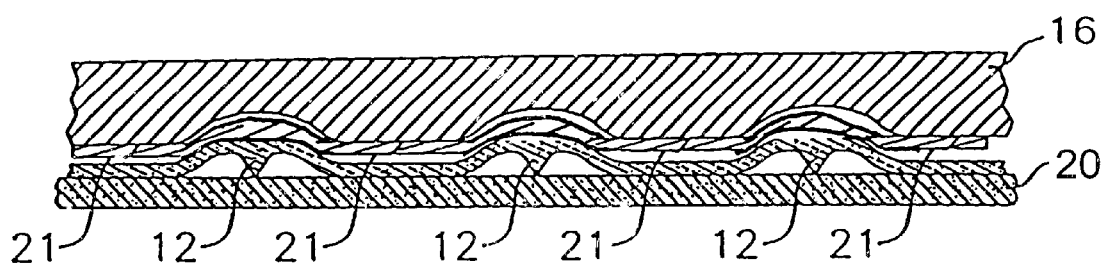
FIG. 10 is a partial cross-sectional view of a connector system of the present invention which shows the shim elastically draping around the gold dots.

The shim 28 may also be used in clamping systems after the elastomer has taken a set as shown in FIG. 6 to still apply a uniform load over the gold dots. In this regard, the shim can be used to save the clamping system in cases where the elastomer has taken a set by providing a means of transferring load from the unset portions 21 of the elastomer to the gold dots 12. Furthermore, shim 28 may be used in cases where the Gold Dot flex circuit 10 has draped but the elastomer 16 has not set as shown in FIG. 7. In an alternate embodiment, the shim 28 is sandwiched between the elastomer 16 and a second elastomer 30 which is positioned between the shim 28 and the flexible Gold Dot circuit 10 as shown in FIG. 8. In other embodiments, more than one shim may be used. For example, shims 28a, 28b of different or the same flexibility may be combined as shown in FIG. 9 for obtaining a desired clamping efficiency.

By using a shim having a flexibility less than that of the Gold Dot flex circuit, the shim will prevent the draping of the flex circuit at loads less than the loads required to cause the shim to drape. Moreover, use of a shim prevents setting of the elastomer when at hot and high load conditions.

Because the shim does not undergo lateral expansion that occurs with thicker elastomers at moderate to high loads, the shim is able to maintain pressure concentration on the Gold Dots under varying loads. Moreover, because the shim is able to better transfer the load from the clamping system to the gold dots, i.e., because the shim increases the efficiency of the clamping system, the actual load applied by the clamping system can be reduced. This allows for clamping parts that are not as strong and which are easier and cheaper to manufacture Furthermore, by decreasing the load applied by the clamping system, the lateral expansion of the elastomer under the load is reduced thereby allowing a smaller clamping system to be used.

What is claimed is:

1. A connector system comprising:

an electronic circuit comprising a plurality of contact surfaces arranged in a pattern;

a connector comprising a plurality of contact surfaces arranged in the pattern and positioned to contact the contact surfaces of the circuit;

a resilient member for urging the connector contact surfaces against corresponding contact surfaces on the circuit;

a shim sandwiched between the resilient member and the connector; and wherein the shim has a resiliency such that the shim does not substantially reduce the compliance of the connector system to accommodate non-uniformities; and wherein the shim's stiffness and resiliency are such that the shim will elastically drape around the plurality of contact surfaces of the connector when exposed to excessive load.

2. A system as recited in claim 1, wherein the connector is a flexible connector.

3. A system as recited in claim 2, wherein the resilient member is an elastomer.

4. A system as recited in claim 3, wherein the connector is a flexible Gold Dot flex circuit.

5. A system as recited in claim 2, wherein the shim and resilient member each have a stiffness, wherein the stiffness of the shim is greater than the stiffness of the resilient member.

6. A system as recited in claim 2, wherein the shim and resilient member each have a resiliency, wherein the resiliency of the shim is greater than the resiliency of the resilient member.

7. A system as recited in claim 2, wherein the shim has a thickness in the range of about 1 to about 5 mils.

8. A system as recited in claim 2, wherein the shim is made from stainless steel.

9. A system as recited in claim 2, wherein the shim is made from Beryllium Copper.

10. A system as recited in claim 2, wherein the shim is made from plastic.

11. A system as recited in claim 2, further comprising a second resilient member sandwiched between the shim and the connector.

12. A system as recited in claim 11, wherein the second resilient member is an elastomer.

13. A system as recited in claim 2, wherein the shim is a metalized layer formed on the surface of the resilient member.

14. A system as recited in claim 13, further comprising a second resilient member sandwiched between the metalized layer and the connector.

15. A system as recited in claim 2, further comprising a second shim sandwiched between the shim and the resilient member.

16. A system as recited in claim 15, wherein the flexibility of one of said shims is different from the flexibility of the other of said shims.

17. A connector system comprising:
an electronic circuit comprising a plurality of contact surfaces arranged in a pattern;
a flexible connector comprising a plurality of contact surfaces arranged in the pattern and positioned to contact the contact surfaces of the circuit;
a resilient member for urging the connector contact surfaces against corresponding contact surfaces on the circuit;
a shim sandwiched between the resilient member and the connector;
a second shim sandwiched between the shim and the resilient member;
wherein the shim has a resiliency such that the shim does not substantially reduce the compliance of the connector system to accommodate non-uniformities; and
wherein the shim and the second shim have the same flexibility.

18. A method for increasing the efficiency of a flexible connector clamping system comprising the steps of:
introducing an electronic circuit comprising a plurality of contact surfaces arranged in a pattern;
placing a flexible connector comprising a plurality of contact surfaces arranged in the pattern over the electronic circuit and aligning the connector contact surfaces with the circuit contact surfaces;
placing a shim over the flexible connector sandwiching the flexible connector between the shim and the electronic circuit;
introducing a resilient material over the shim;
introducing a load on the resilient material for urging the shim and flexible connector against the electronic circuit; and
wherein the shim has a resiliency such that the shim does not substantially reduce the compliance of the clamping system to accommodate non-uniformities; and
wherein the shim's stiffness and resiliency are such that the shim will elastically drape around the plurality of contact surfaces of the connector when exposed to excessive load.

19. A method as recited in claim 18, wherein the connector is a flexible connector.

20. A method as recited in claim 19, wherein the resilient material is an elastomer.

21. A method as recited in claim 19, further comprising the step of introducing a second resilient material between the shim and the flexible connector.

22. A method as recited in claim 21, wherein the second resilient material is a second elastomer.

23. A method as recited in claim 19, further comprising the step of introducing a second shim between the shim and the flexible connector.

24. A method as recited in claim 19, wherein the shim and the resilient material each have a resiliency, wherein the resiliency of the shim is greater than the resiliency of the resilient material.

25. A method as recited in claim 19, wherein the shim has a thickness in the range of about 1 to about 5 mils.

* * * * *